United States Patent [19]

Decker, Jr.

[11] Patent Number: 5,436,554
[45] Date of Patent: Jul. 25, 1995

[54] COMPUTER CONTROLLED CABLE TESTER

[76] Inventor: Harold J. Decker, Jr., 32 Grant Dr., Avon, Conn. 06001-3209

[21] Appl. No.: 940,490

[22] Filed: Sep. 4, 1992

[51] Int. Cl.⁶ .................................................. G01R 31/08
[52] U.S. Cl. ....................................... 324/66; 324/539
[58] Field of Search ............... 324/66, 73.1, 538, 539, 324/540, 542; 379/25, 26

[56] References Cited

U.S. PATENT DOCUMENTS

| | | | |
|---|---|---|---|
| 4,218,745 | 8/1980 | Perkins | 324/66 X |
| 4,224,690 | 9/1980 | Rockwell | 324/540 |
| 4,257,002 | 3/1981 | Helms et al. | 324/66 |
| 4,563,636 | 1/1986 | Snook et al. | 324/66 |
| 4,620,282 | 10/1986 | Shelley | 324/66 X |
| 4,901,004 | 2/1990 | King | 324/66 |
| 4,916,444 | 4/1990 | King | 324/66 X |
| 5,027,074 | 1/1991 | Haferstat | 324/539 |
| 5,155,440 | 10/1992 | Huang | 324/539 |
| 5,280,251 | 1/1994 | Strangio | 324/539 |

*Primary Examiner*—Kenneth A. Wieder
*Assistant Examiner*—Christopher M. Tobin
*Attorney, Agent, or Firm*—Fishman, Dionne & Cantor

[57] ABSTRACT

A device for determining interconnections between terminal positions at opposite ends of cable includes a test circuit, connectors for connecting the test circuit to the terminal positions of the cable and a connector for interfacing the test circuit with a computer. The test circuit sequentially selects each of the terminal positions of the cable as a test point and includes a demultiplexing/multiplexing device for applying a test voltage to the selected terminal position, a resistor for maintaining a load resistance effective to provide a second logic signal at each terminal position other than the terminal position as the test point to which the test voltage is applied and to maintain a first logic signal at each terminal position to which the test voltage is not applied, a memory device for storing the logic signal present at each terminal position during application of the test voltage to the selected test point terminal position, and the demultiplexing/multiplexing device for determining, subsequent to removal of the test voltage from the test point, the logic signals stored by the memory device for each terminal position. A stored first logic signal is indicative of a terminal position not having a common connection with the test point and a stored second logic signal is indicative of a terminal position having a common connection with the test point. A method for determining interconnections between terminal positions at opposite ends of a cable includes operating the above described device.

16 Claims, 6 Drawing Sheets

FIG. 9

COMPUTER CONTROLLED CABLE TESTER

TECHNICAL FIELD

The present invention relates to a device and method for testing, identifying and documenting the pinout of a multiconductor cable.

BACKGROUND OF THE INVENTION

Cables, i.e. two or more wires within a single covering, a wiring harness, i.e. an assembly of discrete insulated wires, have long been used to interconnect the various components of electrical systems.

Typically, cables require testing after fabrication to ensure continuity between terminal positions at opposite ends of the cable. However, a continuity check with a multimeter for a 36 pin to a 36 pin cable with an unknown pinout would require checking about 2500 connections by hand.

A variety of equipment is known for determining interconnections between terminal positions at opposite ends of the cable. U.S. Pat. No. 4,620,282 to Shelley discloses a stand alone cable tester comprising a microprocessor-based tester unit, visual display, printer interface, power supply and test adapters. A printer is provided for documenting the pinout. The device of U.S. Pat. No. 4,620,282 uses customized printer circuit boards for changing connector types. Further, cable signatures and adapter signatures are generated in order to assign unique descriptions to the test cable and adapters required for interfacing the cable to the tester. The adapter signatures are generated by interpretation of hard-wired pins on the printed circuit adapter boards. The cable signature is generated by using an algorithm to assign a unique reference identification to a cable pinout. There is no provision provided for permanently storing the cable pinout for later access in a file or memory, the cable signatures must be compared in order to find discrepancies. The device of U.S. Pat. No. 4,620,282 outputs a test signal to a given test point or pin by means of a demultiplexer integrated circuit chip. The status of each other point or pin under test is then read by the tester while the test signal is still being applied by means of a multiplexer. This testing procedure requires separate multiplexing and demultiplexing components.

U.S. Pat. No. 4,257,002 to Helms et al discloses a stand alone microprocessor based cable tester for comparing the pinout of a known harness to that of an unknown harness. The conditions of the known good harness is stored on cassette tape, and are later input back into the internal memory. The device of U.S. Pat. No. 4,257,002 only determines whether an unknown cable is identical to that of a known cable or that of the information stored in its memory, but does not provide any information as to the pinout of the cable. U.S. Pat. No. 4,257,002 uses a separate IC for inputting and outputting data.

U.S. Pat. No. 4,218,745 is directed to a harness fabrication and testing device. This device uses a separate integrated circuit for input and output signals, which allows testing while the test signal is still being applied. The device of U.S. Pat. No. 4,218,745 requires autoplexed transponders to connect the harness to the computer.

SUMMARY OF THE INVENTION

The above-discussed and other drawbacks and deficiencies of the prior art are overcome or alleviated by the cable tester of the present invention. The cable tester of the present invention is a computer peripheral which is connected to the parallel port of a microcomputer by means of an interface cable, and is powered by a regulated DC power supply.

Each end of a cable which is to be tested is attached to an interface port of the tester by means of an adapter assembly. Using a computer software program, the user inputs the connector configuration (i.e., number of pins and connector numbering scheme). The program is then used to generate the appropriate control signals to the tester and output the pin address to which the test signal is sent. The test signal is output to a data input/output port, through the multiplexer, and to a test point and associated connections. The output state of each connector pin is temporarily stored by a flip-flop circuit connected to each test point, and the test signal is then removed. The address of each connector pin is then sequentially sent to the tester by the program, and the status of the pin is sent from the flip-flops, through the multiplexer, and to the data input/output port. The computer program then analyzes the voltage level present at the data input/output port for each connector pin address to determine whether a HIGH logic level (e.g., +5 volts D.C.) or a LOW logic level (e.g., 0 volts D.C.) condition exists. A HIGH level indicates an open connection and a LOW level is indicative of a shared pin connection with the test pin. After all connector pins have been checked for continuity, the test signal output procedure is repeated for each pin on the test cable. The configuration of the cable is printed to the screen as the test occurs and/or may be stored to disk, sent to a printer, and compared against another cable.

The tester uses the same interface lines for input and output testing operations, and not separate lines as taught in the prior art described hereinbefore.

The flexibility of the tester is greatly enhanced by the software program which may be customized by the user to suit most any application.

BRIEF DESCRIPTION OF THE DRAWINGS

Referring now to the drawings wherein like elements are numbered alike in the several FIGURES.

DETAILED DESCRIPTION OF THE INVENTION

Figure 1:
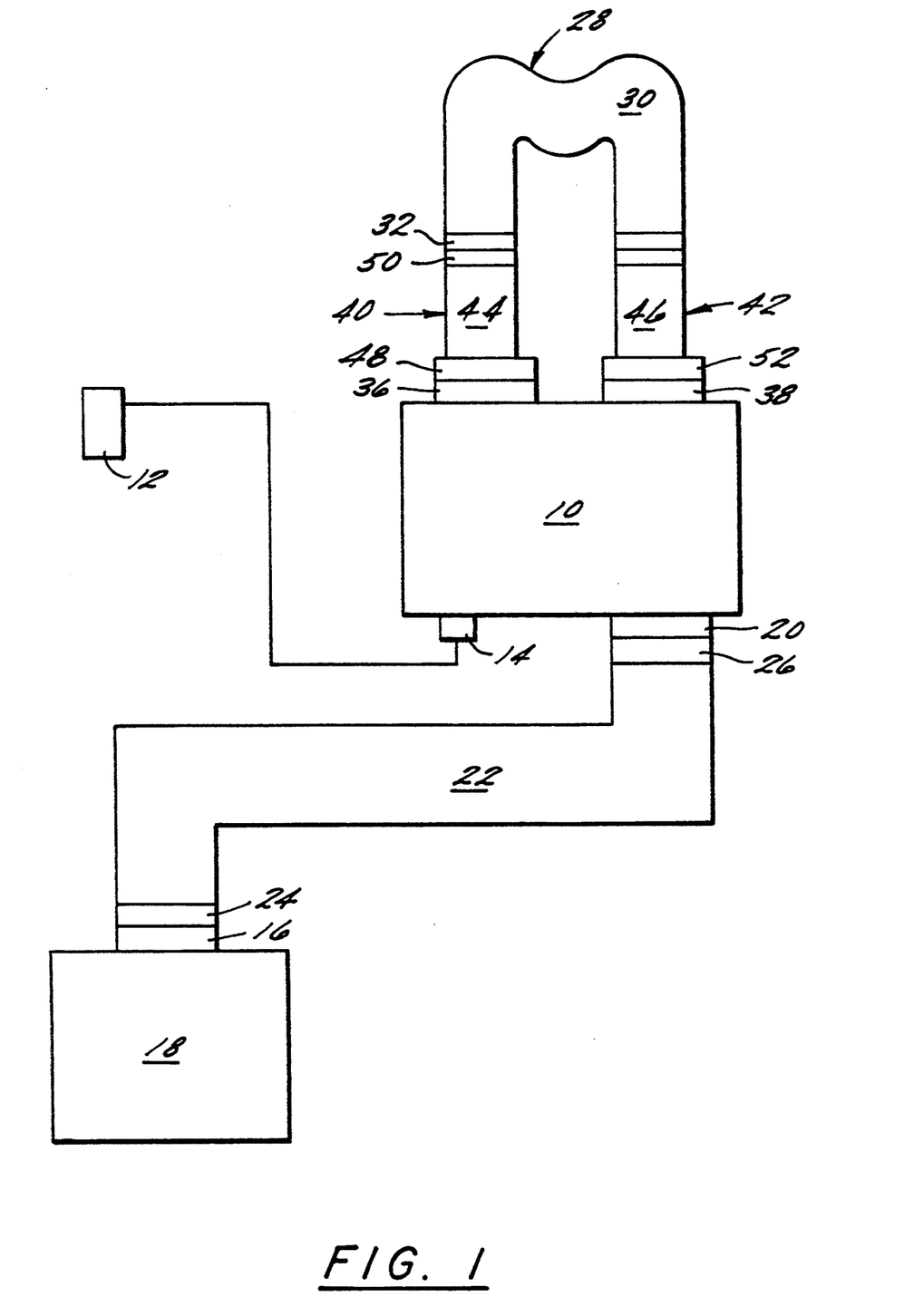
FIG. 1 is a block diagram of a cable tester in accordance with the present invention.

Referring to FIG. 1, a cable testing device in accordance with the present invention is shown generally at 10. Cable tester is preferably powered by a 9–12 volt D.C. source, such as a D.C. adapter 12 via a connector 14. Cable tester 10 is preferably interfaced with a parallel port 16 of a personal computer 18 via a connector 20 and an interface cable 22 having connectors 24, 26. Cable tester 10 is also interfaced with a cable to-be-tested 28 (e.g., a ribbon cable 30 and having connectors 32 and 34). Cable 28 is connected to tester 10 at male header connectors 36, 38 by appropriate modular adapters 40, 42. Adapters 40 and 42 preferably comprise ribbon cables 44, 46, and connectors 48, 50 and 52, 54.

Tester 10 uses the following DB-25 parallel port pin connections for connectors 16, 20, 24 and 26, such as is commonly used with personal computers (e.g. IBM and compatible computers), however other pinouts may be required for use with different computers. The designations for this example are as follows:

| PIN # | TESTER FUNCTION |
|-------|-----------------|
| 2-8   | Address lines   |
| 12    | CCCT on         |
| 13    | Data input/output |
| 14    | Clock signal    |
| 16    | Input/Output select |
| 17    | Output Control  |
| 18-25 | Signal ground   |

It will be appreciated that this pinout does not conform to the designations commonly used for the parallel port or printer connections.

Use of a conventional personal computer 18 (e.g., IBM personal computer) via the parallel interface port, i.e. the printer port, of computer 18 as a control mechanism and user interface for cable tester 10 keeps the cost of cable tester 10 very low. In addition the advantage of using computer software is provided, i.e. the user may develop customized programs to suit his or her own purposes. For example, the user may customize the reference pinout of tester by building a cross reference list of each connector's pins into the program. Alternatively, the tester could be converted from a parallel interface to a serial interface (but tester operation would be slower by the nature of the serial technique). It will be appreciated that, if only one parallel port is available for use, the printer will have to be temporarily disconnected from the computer while the tester is being used. Preferably, the computer is modified to allow simultaneous connections of both the printer and tester by, e.g. installing a secondary parallel adapter card in the computer.

FIGS. 2-5 are a schematic diagram of cable testing devices of the present invention. Integrated circuit logic chips often allow a range of voltages to be interpreted for HIGH and LOW. For example, 74HCT374 flip-flops 67 (FIG. 2C) regard an input voltage between 2.0 and VCC (5.0 volts) as HIGH, and a voltage between 0.0 and 0.8 volts as LOW. The present invention depends upon this allowable voltage range for its operation, as the equivalent output voltage that the flip-flops check at the test points varies between approximately 0.183 volts (for one isolated connection) and approximately 0.670 volts (for seventy-two connections "joined" together). The flip-flop circuitry interprets any voltage within this range as a logic LOW. Many logic chips available on the market often exceed the manufacturer specified ratings (e.g. some flip-flops can interpret voltages above 0.8 volts as a logic LOW).

Referring to FIGS. 2A-C and 3, the parallel port connections between tester 10 and computer 18 are designated C-2 through C-8, C-12, C-13, C-14 and C-16 through C-25. Pull-up resistors (not shown) are used on address, control and data lines to and from computer 18 (i.e., for signals C-2 through C-8, C-13, C-14, C-16 and C-17). These pull-up resistors are preferably 4.7 kilohm resistors and are connected between a voltage designated Vcc and the corresponding signal line. The purpose of the resistors is to pull-up the voltage levels on CMOS multiplexers 58-66 so they are compatible with the TTL levels of the printer port of computer 18, and also to prevent against any signal loss that may occur on the interface lines. Multiplexers 58-66 are preferably CMOS integrated circuits (e.g., 4051 CMOS multiplexers). The power on input line C-12 is connected to Vcc (5 volts), and monitored by computer 18 as to whether the tester is powered on and ready for use, this is signified by a HIGH logic level on the input line.

Figure 2A:
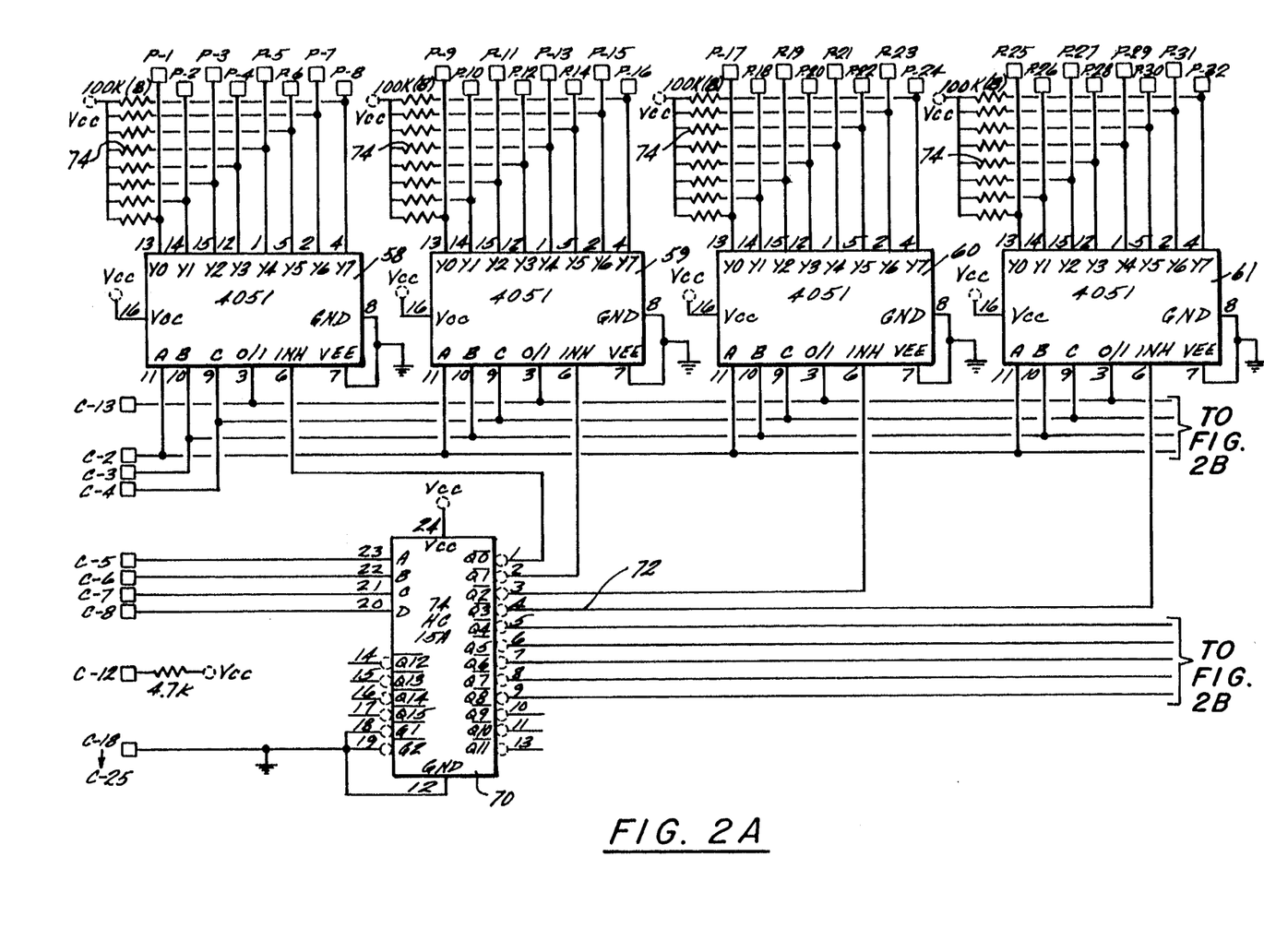
FIGS. 2A–C are a schematic diagram of a portion of a circuit used in the cable tester of FIG. 1.
Figure 2B:
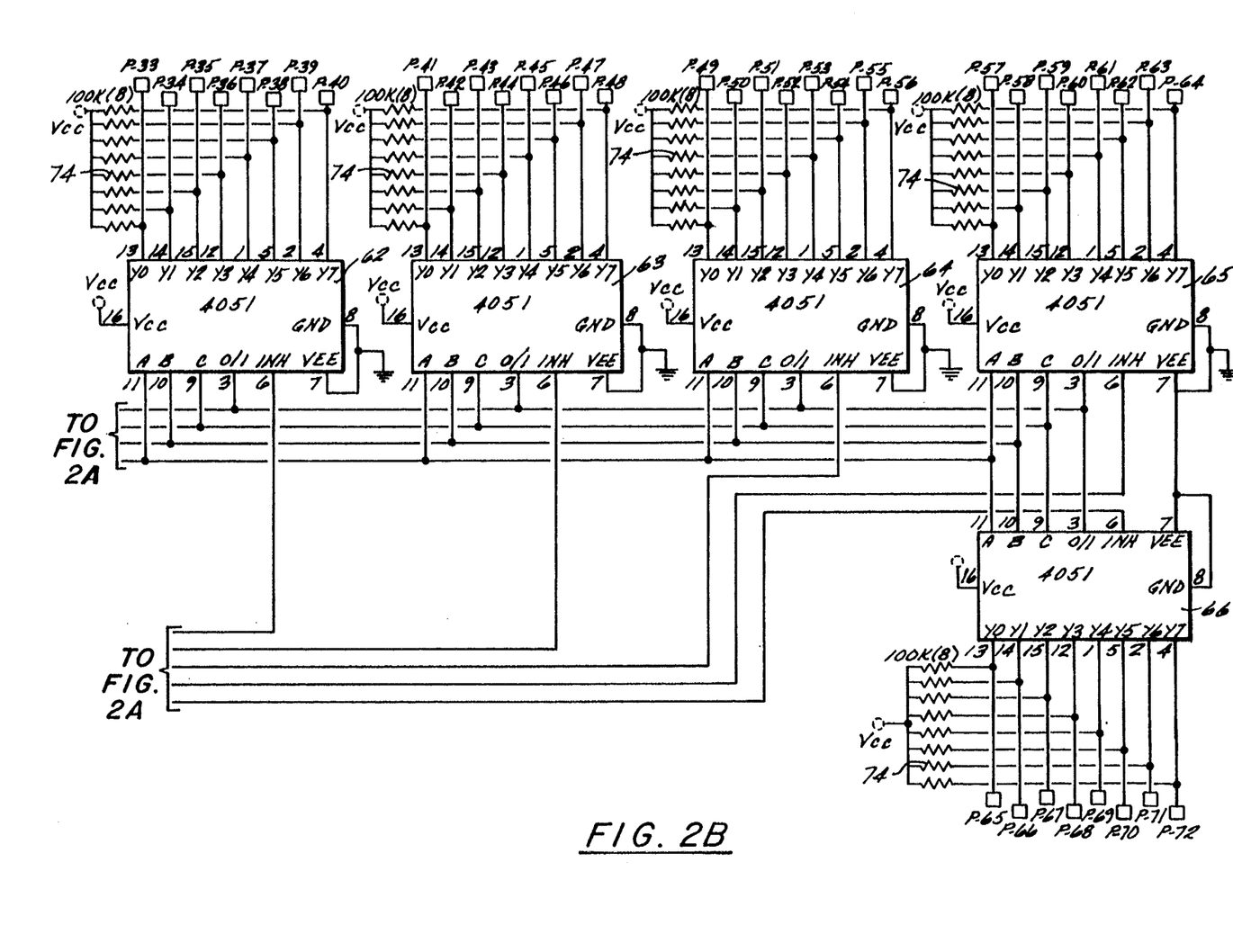
Figure 2C:
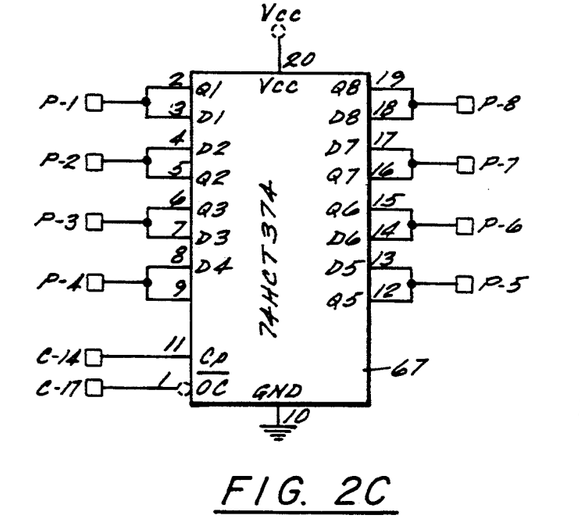
Figure 3:
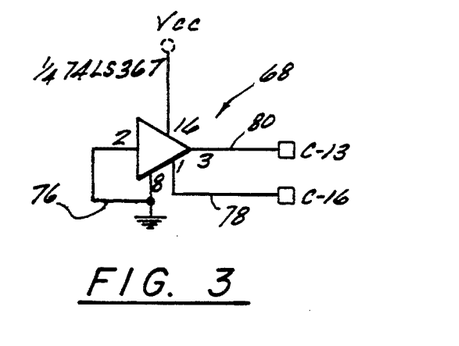
FIG. 3 is a schematic diagram of a portion of the circuit used in the cable tester of FIG. 1.

Test point interface connections are designated P-1 through P-72. In this example, interface connections P-1 through P-36 are used for connector 36 (i.e., connector A) of tester 10 and connections P-37 through P-72 are used for connector 38 (i.e., connector B). Cable 28 (to be tested) is attached to connectors 36 and 38 by means of adapters 40 and 42 described hereinbefore. Line C-13 is a data input/output line which is connected between computer 18 and the common input/output pin of each multiplexer 58-66 (i.e., pin 3 of the 4051 multiplexers) and also to the output of an input/output select circuit 68 (FIG. 3). Line C-13 is used for the transmission of a test voltage generated by buffer 68 from computer 18 to a selected test point, and also for the transmission of each connector pin's status (i.e., HIGH or LOW) from tester 10 to computer 18 once the test voltage signal is removed. A line decoder 70 (e.g., a 74HC154 line decoder or any other compatible 4-16 line decoder) selects the desired multiplexer 58-66 for input or output operation, using the four MSB (most significant bits) of the data address lines C-5 through C-8. This is accomplished by setting one of the output lines 72 of the decoder 70 LOW, which places a LOW on an inhibit input (i.e., pin 6 of the 4051) on one of the multiplexers 58-66 and thus enabling only that selected device.

The multiplexers not selected are inhibited from use by a HIGH on their inhibit inputs, which places these multiplexers in a high impedance state. In this example, only nine of the available sixteen outputs of decoder 70 are used (i.e., one for each multiplexer 58-66). It will be readily appreciated by one of ordinary skill in the art that tester 10 can be easily expanded for up to 128 test points (e.g., with seven additional multiplexers).

The three LSB (least significant bits) of the address lines C-2 through C-4 are used to select the appropriate multiplexer test point designated Y0 through Y7 on each multiplexer 58-66 that will be connected through to the data input/output line (i.e., pin 3 of the 4051 multiplexer common input/output designated I/O) of the multiplexer. It is an important feature of the present invention that transmission of data can take place in two different directions in multiplexers 58-66, which are technically multiplexer/demultiplexers. Data may either be demultiplexed from the data input/output line to a test point (when transmitting a test voltage), or multiplexed from a test point to the data input/output line (when checking for common connections). Resistors 74 are present between each test point P-1 through P-72 and +5 volts. Resistors 74 act as a load when a zero (0) volt D.C. test signal is sent to the test point being checked and subsequently to all other test points sharing a common connection. The load resistor 74 allows the voltage present at that test point (and related common pin connections) to remain at a level equivalent to a logic LOW. Further, resistors 74 pull these lines HIGH when a voltage is not present at the test point, thus preventing the test point voltage from floating (i.e., varying uncontrollably between HIGH and LOW). Resistors 74 should also help protect multiplexers 58–66 from voltage spikes at the test points.

Referring also to FIG. 2C, wherein one of the nine flip-flops 67 is used to temporarily store the logic levels present on each pin connection (i.e. test points P-1 through P-72) during the testing procedure. The flip-flops are tri-state D flip-flops and are preferably 74HCT374 flip-flops described hereinbefore. Each flip-flop 67 allows the storage of the logic level present on eight different test points. Preferably one flip-flop corresponds to one multiplexer. For example, flip-flop 67 corresponds to multiplexer 58, whereby points P-1 through P-8 are common between each. The appropriate input and output connections of each flip-flop bit (e.g., Q1-pin 2 and D1-pin 3) are connected together, thus eliminating the need for separate input and output circuitry at each test point. This configuration allows the logic levels present at each pin connection to be stored by the flip-flop while a test signal voltage is present, and the levels to be retrieved when the test signal voltage is removed. Flip-flop 67 also interfaces with the parallel port of computer 18 over line C-14 (clock signal) and C-17 (output control). In the testing mode, the clock signal is initialized LOW and the output control HIGH. A software generated rising-edge signal appearing on the clock signal input strobes the logic levels present on each of the eight test points into the flip-flops. Upon removal of the test signal from the data input/output line (described hereinbefore), the stored logic levels of each test point can be retrieved from the flip-flops by bringing the output control LOW, transmitting the pin address to check on the address lines, and analyzing the voltage present on each test point at the data input/output line using the computer program.

Referring to FIG. 3 a tri-state buffer circuit for generation and controlling the 0 volt signal which is the output to each test point is shown generally at 68. Buffer 68 is preferably a 74LS367 tri-state hex buffer. An input of buffer 76 is held LOW (i.e., 0 volts D.C.). A control input 78 is connected to line C-16 (i.e., input/output select) of the parallel port, and controls between the output and input modes of operation.

In the output mode, a HIGH signal is sent to the input/output select line C-16 from computer 18 which transmits a 0 volt D.C. test signal generated at an output 80 of buffer 68 to the line C-13 (data input/output line), the pin being tested and other common connections.

To remove the test voltage and switch to the input mode, a LOW is sent to the input/output select line C-16 by computer 18. This results in the buffer output connected to line C-13 being in a high impedance mode, which inhibits the 0 volt signal generated by buffer 68 and allows the logic level of each pin connection P-1 through P-72 to be transmitted on the data input/output line C-13 to computer 18, where it is analyzed by the program.

Figure 5:
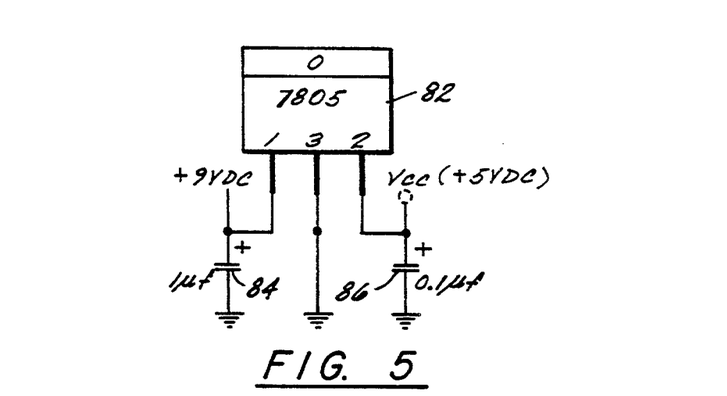
FIG. 5 is a schematic diagram of a portion of the circuit used in the cable tester of FIG. 1.

Referring to FIG. 5 a voltage regulator 82 is shown. Regulator 82 is preferably a 7805, +5 volt, 500 milliamp power device; which can convert an unregulated D.C. input voltage (usually in the range of 9 to 15 volts DC) to a regulated +5 volt D.C. output. The +9 volts D.C. source is supplied by adapter 12 described hereinbefore. Capacitors 84 and 86 provide filtering.

In summary multiplexers 58–66 provide sequential demultiplexing of output test signals to the test points during testing and multiplexing of input signals from the test points after testing. The flip-flops provide storage of the voltage signals at the test points present during testing. Exemplary pinouts of connectors 36, 38, respectively are set forth in Tables 1 and 2 below (the pin numbers listed in the Tables refer to the pin numbers shown in FIGS. 2–5).

TABLE 1

PINOUT OF CONNECTOR 36

| | | | | | | | | | | | | | | | | | | |
|---|---|---|---|---|---|---|---|---|---|---|---|---|---|---|---|---|---|---|
| 35 | 33 | 31 | 29 | 27 | 25 | 23 | 21 | 19 | 17 | 15 | 13 | 11 | 9 | 7 | 5 | 3 | 1 | |
| 36 | 34 | 32 | 30 | 28 | 26 | 24 | 22 | 20 | 18 | 16 | 14 | 12 | 10 | 8 | 6 | 4 | 2 | |

Front View

TABLE 2

PINOUT OF CONNECTOR 38

| | | | | | | | | | | | | | | | | | | |
|---|---|---|---|---|---|---|---|---|---|---|---|---|---|---|---|---|---|---|
| 71 | 69 | 67 | 65 | 63 | 61 | 59 | 57 | 55 | 53 | 51 | 49 | 47 | 45 | 43 | 41 | 39 | 37 | |
| 72 | 70 | 68 | 66 | 64 | 62 | 60 | 58 | 56 | 54 | 52 | 50 | 48 | 46 | 44 | 43 | 40 | 38 | |

Front View

Tester 10 has an output drive capacity (i.e., fan-out) of at least seventy-two connections. Fan-out is defined as the number of input loads that an output (i.e., test point) can drive and still maintain its correct logic levels. Because of the aforementioned voltage range of the integrated circuits (ICs), a test point may share a common connection with at least seventy-two other connection points. Such multiple connections rarely occur in cable designs, normally a maximum of five to ten connections are ever tied together. This large fan-out is achievable due to the fact that tester 10 performs input and output routines separately, the tester is constructed with IC's having tri-state outputs and the working voltage ranges of the IC's used.

It should be noted that since the number of pins used for each connector and connector numbering schematic are software definable as set forth below, the pin numbers provided in Tables 1 and 2 are merely illustrative.

Tester 10 may be used for any type of cable which may be interfaced by adapter 40 and 42 to connectors 36 and 38 respectfully (limited by the available number of pins). Some examples of cables which may be tested includes RS-232 serial, parallel printer, telephone cords, and practically any other type for which adapters 40 and 42 may be configured.

For example, tester 10 may be used to analyze the pinout of an unknown cable without taking apart the connectors (many new cables come with permanently bonded connectors which can not be removed without damaging the connector, cable, or both). A continuity check with a multimeter for a 36 pin-to-36 pin cable with an unknown pinout would require checking about 2600 connections by hand. Needless to say, the possibility for user error using this method would be great. Tester 10, on the other hand, will perform the same test in about a minute or less (actual time dependent on speed of computer 18), and the computer software could display the configuration on the screen, send it to a printer, store it to disk, or compare it against another cable pinout. Tester 10 may also be easily checked for proper operation with a simple thirty-six conductor cable used as a loopback test cable.

Another use of tester 10 is for comparing cable pinouts. A known good cable is attached to tester 10, for generating a printout of the configuration (i.e. pinout) on paper or stored on a computer disk. This information can then be used for future testing of a cable whereby the pinout or printout is compared with the original.

This process does not require any knowledge of computer cable construction.

A novel approach is employed by cable tester 10. The same multiplexer integrated circuit (IC) is used for both multiplexing and demultiplexing procedures, thus eliminating the need for separate IC for each type of operation. It is an important feature of the present invention, that the 4051 series CMOS multiplexer, a commonly used IC for multiplexing, is also capable of demultiplexing.

Figure 4:
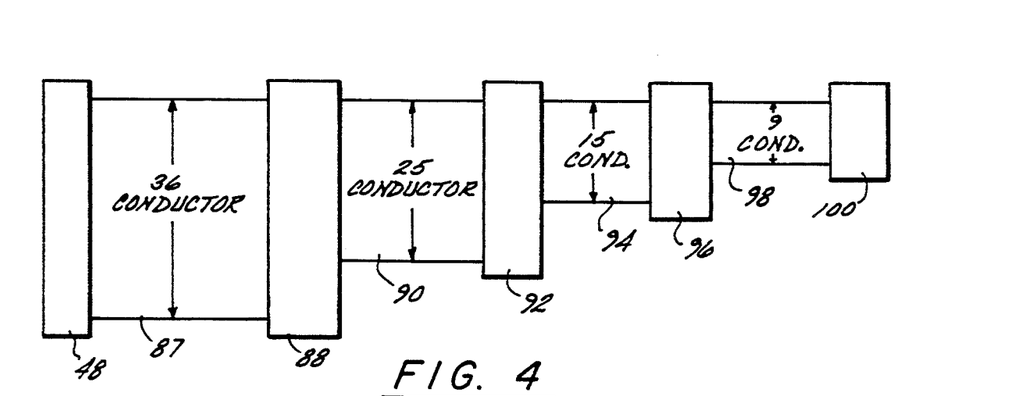
FIG. 4 is a diagramatic view of an adapter used in the cable tester of FIG. 1.

In practice thirty-six pin/socket connectors are not readily available, therefore tester 10 uses forty pin connectors (which are readily available). These connectors are preferably insulation displacement connectors (IDC). An adapter 40 (or 42) is shown in FIG. 4. A 40-pin male header connector 36 (or 38) on tester 10 mates with a 40-pin female socket connector 48 which is easily removed by ejection latches (not shown) commonly mounted on the plug connectors. Attached to the header socket assembly, using ribbon cable, are various IDCs. Multiple connectors may be placed on each cable assembly, or a custom set may be developed for each connector used. Also, various converters or gender changers may be used to achieve the desired results. Adapter 40 has both socket and plug-type cable assemblies; a 36 conductor ribbon cable 87 with connector 48 and a 36 pin Centronics-type connector 88, a 25 conductor ribbon cable 90 with connector 88 and a DB25 connector 92, a 15 conductor ribbon cable 94 with connector 92 and DB15 connector 96 and a 9 conductor ribbon cable 98 with connector 96 and DB9 connector 100 are provided on each assembly. This enables testing of most cables normally encountered with computers.

Two of the above-described cable adapter assemblies, (one having plug connectors and the other having compatible socket connectors) allow testing of a wide variety of harnesses and cables.

Also, many other types of connectors may be interfaced with tester 10 (e.g., DB25 to modular phone socket connectors). Testing limitations may be affected by cable characteristics (e.g., shielded, unshielded, wire gauge, resistance).

Tester 10 requires that cable 28 (i.e., the cable under test) does not have any voltages active upon it, such voltages may damage tester 10. While it is preferred that both ends of cable 28 be plugged into tester 10 for testing purposes, a simple loopback plug may be developed for one end of the cable. This will allow the output test signal of tester 10 to be sent back to another known tester return wire. For example, in most RS-232 serial applications, only 9 pins (1-8 and 20) are used. The signals from these pins may be looped back to tester 10 on unused connections by wiring pairs of connections together.

Tester 10 is a computer peripheral and not a stand-alone device. Although, it is within the scope of the present invention that tester 10 could be made a stand-alone device, as is readily understood by one of ordinary skill in the art. Further, tester 10 could be used with a portable laptop computer to test cables in the field, whereby tester 10 (with a battery power source) becomes portable.

Tester 10 of the present invention differs from the testers of U.S. Pat. No. 4,620,282 to Shelley and of U.S. Pat. No. 4,257,002 to Helms which both use the common technique of testing the input signals while the output signal is still being applied, requiring one component for input (multiplexing) and another for output (demultiplexing). Tester 10 uses a single 4051 CMOS component for both. U.S. Pat. No. 4,218,745 to Perkins and U.S. Pat. No. 4,257,002 to Helms use one 4051 component for demultiplexing and another 4051 component for multiplexing. The present invention takes greater advantage of the capabilities of this device which is capable of both multiplexing and demultiplexing, thus requiring only one IC component for this input/output procedure. In tester 10 of the present invention, each 4051 IC is connected to a memory circuit (i.e., flip-flops) which are used to store the signals present at each pin. A LOW is transmitted to one test point through the 4051 IC, the memory circuit is enabled using control lines from computer 18, and the applied signal is removed thus storing a LOW at each common pin connection and a HIGH at all other connections. Each test point is then analyzed for a 0 volt D.C. signal which indicates continuity between said pin and the pin to which the signal was applied.

The method of using the cable testing device 10 of the present invention will be discussed with reference to FIGS. 6-9.

Figure 6:
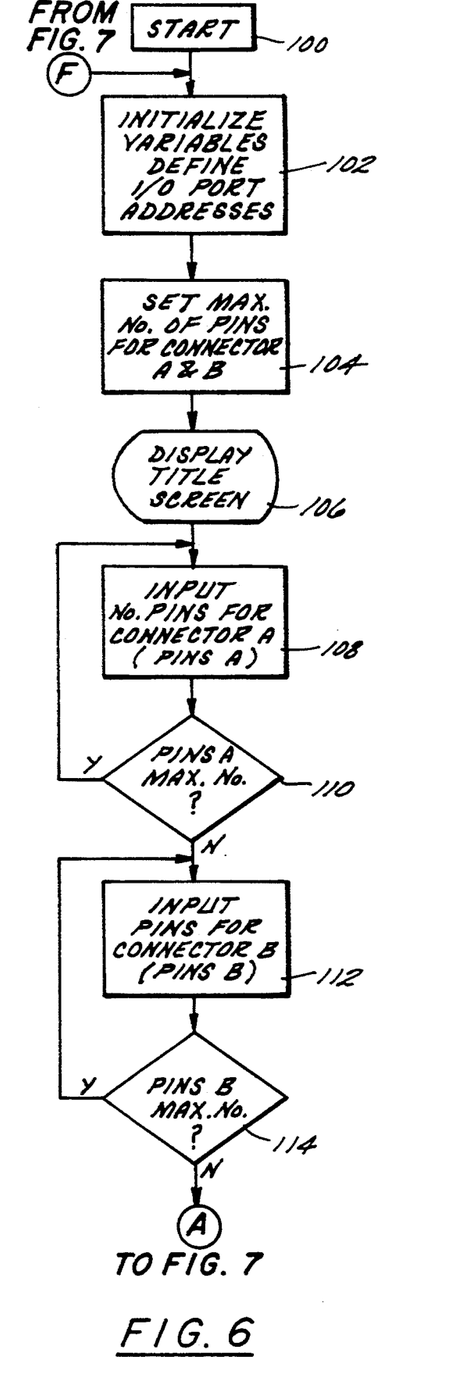
FIGS. 6–9 are a flow chart of the operation of the cable tester of FIG. 1.

Proceeding downwardly from the top of FIG. 6, an initial address of zero is first output to the address lines to clear any previous or erroneous address which may be present and the printer interface port addresses are defined, as indicated at 102. The maximum number of pins capable of being tested is defined, as indicated at 104.

A title screen is displayed on computer 18, as indicated at 106. The number of pins (PINS A) for connector 36 are input at block 108 and checked at block 110 so as to not exceed the number of pins for connector 36 set in block 104. The number of pins (PINS B) for connector 38 are input at block 112 and checked at block 114 so as to not exceed the number of pins for connector 38 set in block 104.

Figure 7:
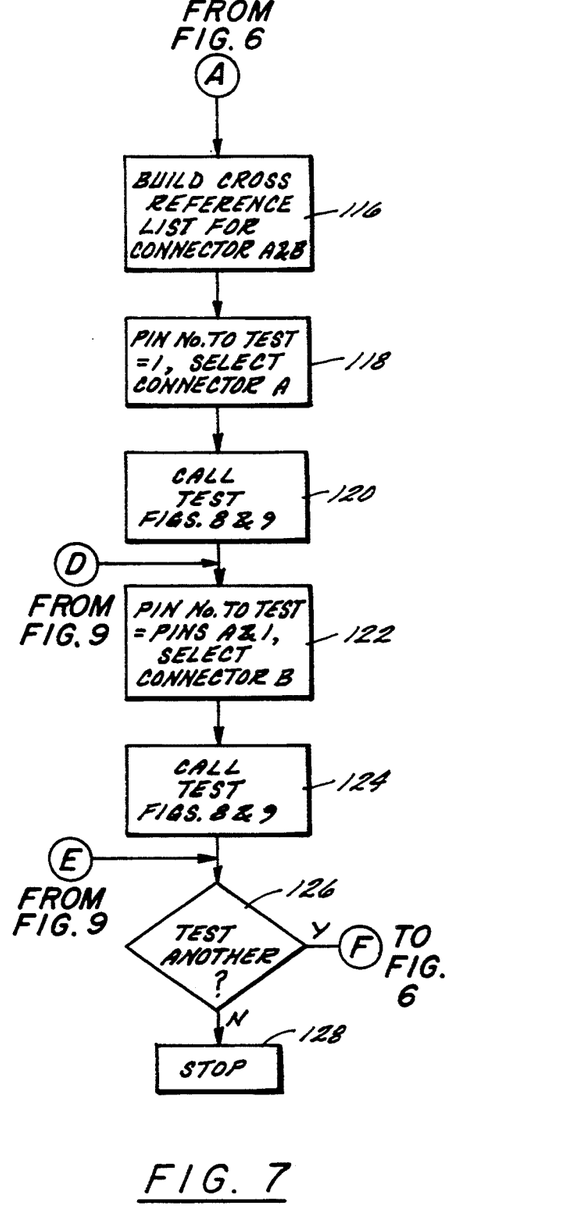

Proceeding downward from the top of FIG. 7, a cross reference list of pin connections is constructed by the computer program based upon the user's selection of interface connector type and number of pins, as indicated at 116.

The test looping procedure is then started by the program whenever the TEST subroutine is called, indicated at blocks 120 (connector A) and 124 (connector B). The LOW (0 volt) test signal from the buffer output is then transmitted to the pin being tested and to all associated connections. Connector A 36 is tested first at blocks 118, 120.

Figure 8:
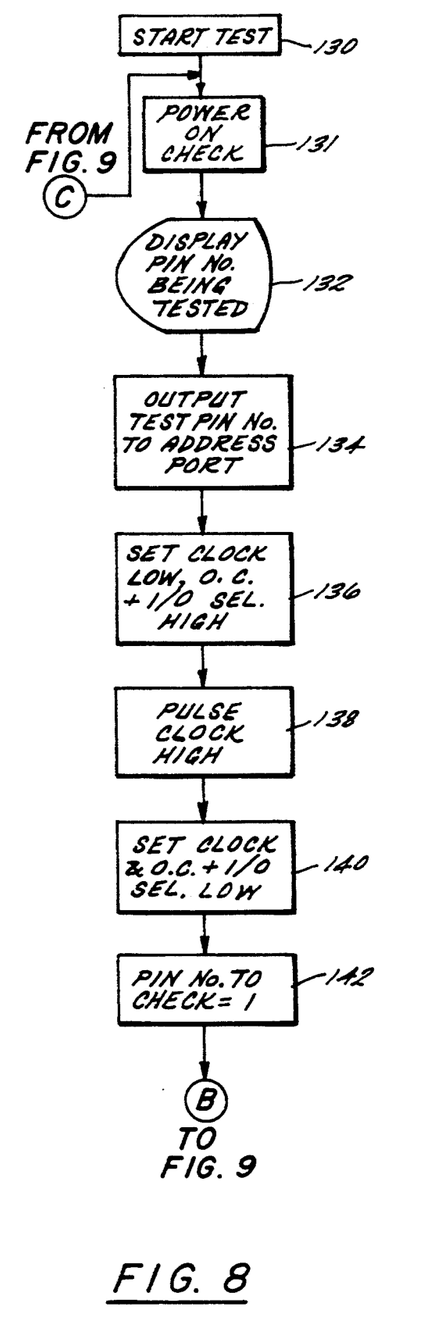

Proceeding downward from the top of FIG. 8, power on for the tester is checked at 131. The first pin address to test is sent to the address lines, as indicated at 134. The pin number being tested is displayed, as indicated at 132. The three LSB bits are selected by the three address lines of ICs 58-66 and the four MSB bits by IC 70's address lines which send a LOW to the selected inhibit line of ICs 58-66.

All control signals are initialized, which sets the I/O select line HIGH (i.e., output mode), output control HIGH (output mode enabled), and the clock signal LOW, as indicated at 136. The printer port connections for the clock, I/O select and output control use inverted logic levels, therefore a software logic LOW must be sent to the port in order to achieve a logic HIGH. Also, since only the rising edge of the clock signal is used by tester 10, the clock may either be pulsed LOW-HIGH-LOW or HIGH-LOW-HIGH by the program, as long as a rising clock signal is generated. It is this rising edge which latches the status of each pin connection. In this example, the clock is pulsed LOW-HIGH-LOW.

The clock signal is pulsed HIGH and back LOW, enabling the storage capability of the flip-flop circuitry, as indicated at 138. The I/O select and the output control are then brought LOW. Bringing I/O select LOW disables the LOW present on the data input/output line, by placing the output of the buffer in a high impedance (inhibited) state. Bringing output control LOW allows the logic levels stored by the flip-flop circuitry for each pin to be assessed and sent on the data I/O line, as indicated at 140. Resistors 74 pull-up the voltage present at each test point to a HIGH when a test signal is not applied and act as a load when a test signal is applied, to allow transmission of the LOW signal to the test point and related connections and prevent against an electrical short to ground.

Each pin of both connector interfaces is now checked for the logic level (HIGH OR LOW) stored by the flip-flop circuitry. Pin number 1 on connector 36 (A) is checked first, as shown by block 142.

Figure 9:
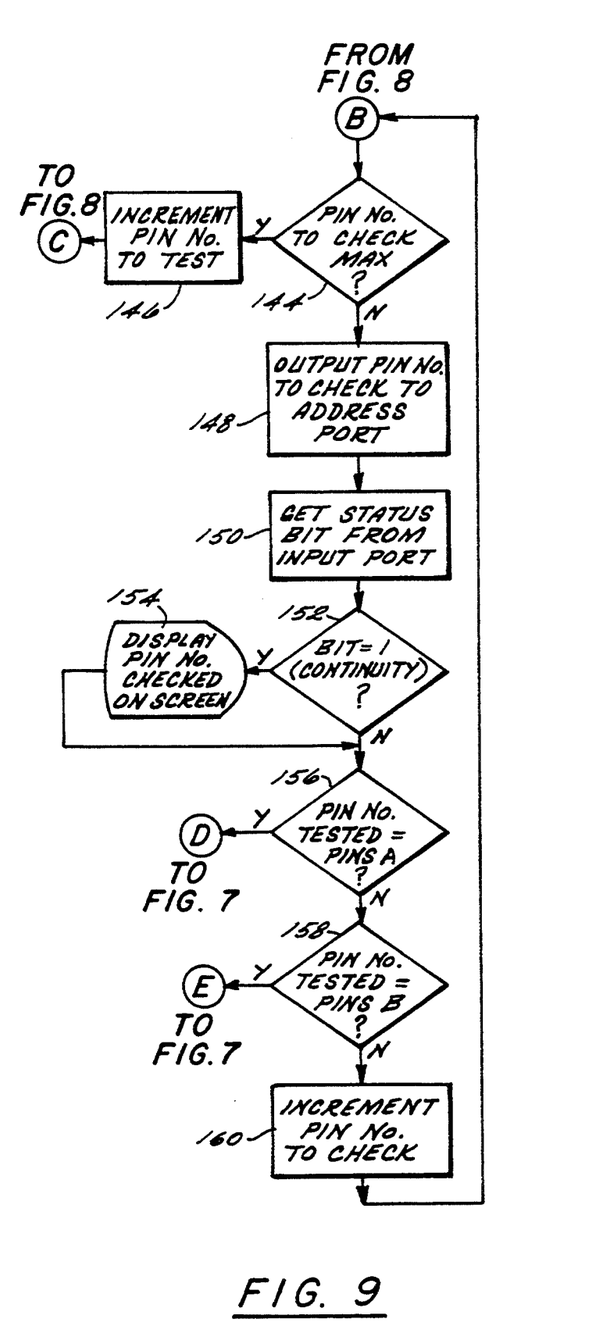

Proceeding downward from the top of FIG. 9, a loop defined by blocks 144, 148, 150, 152, 156, 158 and 160 is used to examine the status of the pin number being checked and then increment it if necessary. First, the program examines the value of the selected pin being checked to see if its value is greater than the sum of the number of pins defined for connector 36 (PINSA block 108) and connector 38 (PINSB block 112). If the value is greater, then the program will increment the pin number to test (block 146) and loop back to FIG. 8. Otherwise, the program will output the pin number to check to the address port (block 148) of tester 10 and examine the status of the logic level present on the data input/output port (block 150). If the logic level is LOW, then the pin checked shares a common connection with the test pin, as indicated at 152 and 154. If the logic level is HIGH, then the selected pin connection is noted on the computer screen (block 154), sent to a disk file, or listed on an attached printer. The program will then increment the pin number to check (block 160), and continue to check for continuity until the pin number being tested is equal to the last pin number defined for connector 36 (block 156) or connector 38 (block 158). If the pin number being tested is the last pin number of connector 36, then the program has finished checking the pins on connector 36 and will loop back to check the pins on connector 38, as defined by blocks 122 and 124. If the pin number being tested is the last pin number of connector 38 (block 158), then the program has completed testing the cable. Another cable test can be selected at 126, otherwise the program will stop 128.

While preferred embodiments have been shown and described, various modifications and substitutions may be made thereto without departing from the spirit and scope of the invention. Accordingly, it is to be understood that the present invention has been described by way of illustrations and not limitations.

What is claimed is:

1. A device for determining interconnections between terminal positions at opposite ends of a cable, comprising:
   means for testing said terminal positions, comprising:
      means for initializing said terminal positions with a first logic signal;
      demultiplexing means for sequentially selecting each terminal position as a test point and applying a test voltage thereto;
      resistor means for applying a load resistance effective to maintain a second logic signal at each terminal position having the test voltage thereon and to maintain the first logic signal at each terminal position not having the test voltage thereon;
      memory means for storing the logic signals present at all terminal positions during application of the test voltage to the test point; and
      multiplexing means for determining subsequent to removal of the test voltage from the test point the logic signal stored at the memory means for each terminal position, a stored first logic signal being indicative of a terminal position not having a common connection with the test point and a stored second logic signal being indicative of a terminal position having a common connection with the test point;
   connector means for connecting said means for testing with said terminal positions; and
   interface means for interfacing with a computer.

2. The device of claim 1 wherein said demultiplexing means and said multiplexing means comprise a multiplexer/demultiplexer integrated circuit.

3. The device of claim 2 wherein said multiplexer/demultiplexer integrated circuit comprises a CMOS 4051 integrated circuit.

4. The device of claim 1 wherein said memory means comprises a flip-flop circuit.

5. The device of claim 4 wherein said flip-flop circuit comprises a plurality of tri-state D flip-flops each having an input and an output connected together and connected to a corresponding terminal position.

6. The device of claim 1 wherein said demultiplexing means and said multiplexing means comprise a plurality of multiplexer/demultiplexer integrated circuits; and further comprising:
   means for selecting one of said plurality of multiplexer/demultiplexer integrated circuits.

7. The device of claim 6 wherein said means for selecting comprises a decoder integrated circuit.

8. The device of claim 1 further comprising:
   adapter means for connecting between said connector means and the ends of the cable.

9. A method for determining interconnections between terminal positions at opposite ends of a cable, comprising the steps of:
   initializing the terminal positions with a first logic signal,
   sequentially selecting each terminal position as a test point and applying a test voltage thereto, while a load resistance effective to maintain a second logic signal at each terminal position having the test voltage thereon and to maintain the first logic signal at each terminal position not having the test voltage thereon is applied;
   storing the logic signals present at all terminal positions during application of the test voltage to the test point; and
   determining, subsequent to removal of the test voltage from the test point, the logic signal stored for each terminal position, wherein a first logic signal is indicative of a terminal position not having a common connection with the test point and a stored second logic signal is indicative of a terminal position having a common connection with the test point.

10. The method of claim 9 wherein said step of sequentially selecting and said step of determining comprise sequentially selecting and determining using a multiplexer/demultiplexer integrated circuit.

11. The method of claim 10 wherein said multiplexer/demultiplexer integrated circuit comprises a CMOS 4051 integrated circuit.

12. The method of claim 9 wherein said step of storing comprises storing the logic signal using a flip-flop circuit.

13. The method of claim 12 wherein said flip-flop circuit comprises a plurality of tri-state D flip-flops each having an input and an output connected together and connected to a corresponding terminal position.

14. The method of claim 9 wherein said step of sequentially selecting and said step of determining comprise sequentially selecting and determining using a plurality of multiplexer/demultiplexer integrated circuits; and further comprising the step of:
selecting one of said plurality of multiplexer/demultiplexer integrated circuits.

15. The method of claim 14 wherein said step of selecting comprises selecting using a decoder integrated circuit.

16. The method of claim 9 further comprising the step of:
connecting between said connector means and the ends of the cable using adapter means.

* * * * *